United States Patent
Gotsmann et al.

(10) Patent No.: US 9,714,863 B2
(45) Date of Patent: Jul. 25, 2017

(54) OPTICAL SPECTROMETER

(71) Applicant: International Business Machines Corporation, Armonk, NY (US)

(72) Inventors: Bernd W. Gotsmann, Horgen (CH); Siegfried F. Karg, Adliswil (CH); Emanuel Loertscher, Bonstetten (CH); Heike E. Riel, Baech (CH); Giorgio Signorello, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 14/647,992

(22) PCT Filed: Nov. 8, 2013

(86) PCT No.: PCT/IB2013/060010
§ 371 (c)(1),
(2) Date: May 28, 2015

(87) PCT Pub. No.: WO2014/083461
PCT Pub. Date: Jun. 5, 2014

(65) Prior Publication Data
US 2015/0308891 A1    Oct. 29, 2015

(30) Foreign Application Priority Data
Nov. 29, 2012 (GB) .................... 1221502.6

(51) Int. Cl.
*G01J 3/02* (2006.01)
*B82Y 20/00* (2011.01)
(Continued)

(52) U.S. Cl.
CPC ............. *G01J 3/0202* (2013.01); *B82Y 20/00* (2013.01); *G01J 1/0204* (2013.01);
(Continued)

(58) Field of Classification Search
CPC .................................................... G01J 3/0202
See application file for complete search history.

(56) References Cited

U.S. PATENT DOCUMENTS 6,249,345 B1    6/2001  Kraack et al.
6,339,217 B1 *  1/2002  Kley ..................... B82Y 20/00
                                                              250/216

(Continued)

FOREIGN PATENT DOCUMENTS

GB       2508376 A      6/2014
JP    2003209270 A      7/2003

(Continued)

OTHER PUBLICATIONS

Kim et al., "Optically activated Si nanowires and nanoribbons as a platform for Si-based photonics," 2007 4th IEEE International Conference on Group IV Photonics, 2007, pp. 213-215, © 2007 IEEE DOI: 10.1109/GROUP4.2007.4347719.

(Continued)

*Primary Examiner* — Tarifur Chowdhury
*Assistant Examiner* — Omar Nixon
(74) *Attorney, Agent, or Firm* — Robert J. Shatto

(57) ABSTRACT

An optical spectrometer contains a photodiode and a straining mechanism for imposing adjustable strain on the photodiode. The spectrometer includes a measurement apparatus for measuring variation of photocurrent with strain at different values of the adjustable strain imposed by the straining mechanism. Adjusting the strain allows adjustment of the band gap $E_g$ of the photosensitive region of the photodiode, and this determines the cut-off energy for absorption of photons. Measuring variation of photocurrent with strain at different values of the adjustable strain imposed by the straining mechanism allows study of pho- (Continued)

tons within a desired energy range of the band gap energy corresponding to each strain value.

21 Claims, 6 Drawing Sheets

(51) Int. Cl.
| H01L 31/105 | (2006.01) |
| G01J 1/04 | (2006.01) |
| G01J 1/42 | (2006.01) |
| G01J 3/28 | (2006.01) |
| H01L 31/0352 | (2006.01) |
| G01J 1/02 | (2006.01) |

(52) U.S. Cl.
CPC ............ *G01J 1/0429* (2013.01); *G01J 1/0448* (2013.01); *G01J 1/42* (2013.01); *G01J 3/0224* (2013.01); *G01J 3/0237* (2013.01); *G01J 3/28* (2013.01); *G01J 3/2803* (2013.01); *H01L 31/035227* (2013.01); *H01L 31/105* (2013.01)

(56) References Cited

U.S. PATENT DOCUMENTS

| 6,844,930 | B2 | 1/2005 | Kobayashi et al. | |
| 7,345,764 | B2 | 3/2008 | Bulovic et al. | |
| 7,403,284 | B2 | 7/2008 | Grek et al. | |
| 7,420,156 | B2 | 9/2008 | Kim et al. | |
| 7,502,109 | B2 | 3/2009 | Bonne et al. | |
| 7,663,202 | B2 | 2/2010 | Wang et al. | |
| 7,889,336 | B2 | 2/2011 | Yankov | |
| 8,031,336 | B2 | 10/2011 | Shibayama et al. | |
| 8,045,155 | B2 | 10/2011 | Suzuki et al. | |
| 8,045,157 | B2 | 10/2011 | Shibayama et al. | |
| 8,049,887 | B2 | 11/2011 | Suzuki et al. | |
| 8,068,223 | B2 | 11/2011 | Suzuki et al. | |
| 8,068,224 | B2 | 11/2011 | Shibayama et al. | |
| 8,089,626 | B2 | 1/2012 | Iddan | |
| 8,212,235 | B2 | 7/2012 | Wang et al. | |
| 2004/0165623 | A1* | 8/2004 | Imaki | G01J 4/04 372/32 |
| 2004/0196458 | A1 | 10/2004 | Shimizu et al. | |
| 2009/0057536 | A1* | 3/2009 | Hirose | G01J 1/04 250/208.1 |
| 2009/0195869 | A1* | 8/2009 | Kim | G01N 21/21 359/386 |
| 2009/0267049 | A1* | 10/2009 | Cho | H01L 33/18 257/13 |
| 2010/0290217 | A1* | 11/2010 | Anantram | B82Y 20/00 362/159 |
| 2011/0273709 | A1 | 11/2011 | Sweeney | |
| 2012/0050735 | A1* | 3/2012 | Higgins | G01L 1/24 356/326 |
| 2012/0113419 | A1 | 5/2012 | Wang et al. | |
| 2012/0129269 | A1 | 5/2012 | Choi et al. | |
| 2012/0153119 | A1 | 6/2012 | Patil et al. | |
| 2012/0153860 | A1 | 6/2012 | Wang et al. | |
| 2012/0280203 | A1 | 11/2012 | Barwicz | |

FOREIGN PATENT DOCUMENTS

| JP | 2008140967 A | 6/2008 |
| WO | 9940624 A1 | 8/1999 |
| WO | 2011044226 A2 | 4/2011 |
| WO | 2012066444 A1 | 5/2012 |
| WO | 2014083461 A1 | 6/2014 |

OTHER PUBLICATIONS

Servati et al., "Scalable silicon nanowire photodetectors," Science Direct, 2007, pp. 64-66, © 2007 Published by Elsevier B.V., DOI:10.1016/j.physe.2006.12.054.

Sun et al., "Electrical Characteristics and Photocurrent Spectral Response of Si Nanowires p-i-n. Junctions," 2010 Photonics Global Conference, 2010, pp. 1-2, © 2010 IEEE DOI: 10.1109/PGC.2010.5705948.

Unknown, "Ocean Optics: STS Series," last accessed May 12, 2015, pp. 1-2, © 1989-2015 Ocean Optics, Inc. http://www.oceanoptics.com/products/sts.asp.

Xia et al., "High resolution on-chip spectroscopy based on miniaturized microdonut resonators," Optics Express 12356, Jun. 20, 2011, pp. 1-9, vol. 19, No. 13, © 2011 Optical Society of America.

International Search Report and Written Opinion, International Application No. PCT/IB2013/060010, International Filing Date Aug. 11, 2013.

Foreign Search Report, Patents Act 1977: Search Report under Section 17(5), Application No. GB1221502.6, Dated Mar. 15, 2013.

* cited by examiner

_US 9,714,863 B2_

OPTICAL SPECTROMETER

BACKGROUND

This invention relates generally to optical spectrometers.

Optical spectrometers are instruments used to study intensity of light as a function of wavelength (where "light" herein refers to electromagnetic radiation generally and is not limited to the visual region of the electromagnetic spectrum). An optical spectrometer is composed of two basic elements. These are: a light filtering device, which allows the propagation of light within a selected portion of the energy spectrum; and a light sensor consisting of one or more photodetectors, usually a photodetector array. Typical photodetectors might be CMOS (complementary metal oxide semiconductor) capacitors or photodiodes which convert incident photons into electronic charge. A photodiode is a semiconductor device incorporating a PN junction, or PIN junction, operated in reverse bias. Absorption of photons with energies above the band gap of the device causes excitation of carriers across the band gap, resulting in generation of a current (the "photocurrent").

In order to select a spectral region, conventional spectrometers rely on angular dispersion of light beams by prisms or diffraction gratings. To exploit the angular dispersion, the light needs to propagate over finite distances of the order of several wavelengths. This need for spatial propagation limits the extent to which the energy filtering part of a spectrometer can be scaled down in size. This, in turn, has limited further miniaturization of the entire optical spectrometer and prohibited the integration of spectrometers in other, more complex systems.

SUMMARY

Embodiments of the present disclosure include an apparatus and method for detecting and measuring the intensity of spectral lines at target wavelengths. In an embodiments, this disclosure includes an optical spectrometer apparatus. The optical spectrometer includes a photodiode to convert energy from light into a photocurrent. A straining mechanism is attached to the photodiode to impose adjustable strain on the photodiode. The photodiode is electrically coupled with a measurement apparatus to measure the photocurrent output by the photodiode.

In another embodiment, the present disclosure includes a method for measuring the intensity of spectral lines at target wavelengths using a photodiode. The photodiode is exposed to a light source that is to be measured. A straining mechanism imposes an adjustable strain on the photodiode. A measurement device measures the photocurrent output by the photodiode at different levels of strain.

In general, where features are described herein with reference to an embodiment of one aspect of the invention, corresponding features may be provided in embodiments of another aspect of the invention as appropriate.

BRIEF DESCRIPTION OF THE DRAWINGS

Preferred embodiments of the invention will now be described, by way of example, with reference to the accompanying drawings in which.

DETAILED DESCRIPTION

Figure 1:
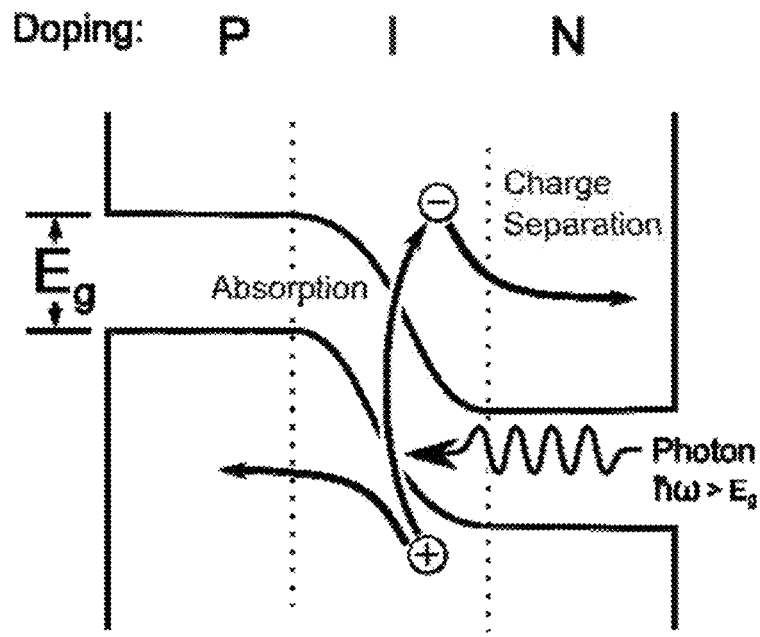
FIG. 1 illustrates principles of photodiode operation.

According to an embodiment of one aspect of the invention there is provided an optical spectrometer that includes:

a photodiode;

a straining mechanism for imposing adjustable strain on the photodiode; and a measurement apparatus for measuring variation of photocurrent with strain at different values of said adjustable strain imposed by the straining mechanism.

Embodiments of the invention exploit a phenomenon observed in semiconductor structures whereby the electronic energy bands can be modified by subjecting the structure to strain. As a result of this phenomenon, the band gap of the photosensitive region of the PN (or PIN) junction implementing a photodiode (referred to hereinafter as the band gap $E_g$) can be modified by imposition of strain. In embodiments of this invention, a straining mechanism is provided to impose strain which is adjustable. Adjusting the strain allows the band gap to be adjusted accordingly. The band gap $E_g$ determines the cut-off energy for absorption of photons: only photons with energies above $E_g$ can excite carriers across the band gap and so contribute to the photocurrent. At any particular value of the applied strain, and hence corresponding value of the band gap $E_g$, if the band gap is varied within a range $\Delta$ of this value then the minimum energy of photons which can contribute to the photocurrent will vary accordingly. The resulting variation of photocurrent is therefore due to photons with energies in the range $\Delta$.

In spectrometers according to embodiments of the invention, the measurement apparatus measures variation of photocurrent with strain (and hence band gap energy) at different values of the adjustable strain imposed by the straining mechanism. This allows study of photons within a desired energy range $\Delta$ of the band gap energy corresponding to each strain value, permitting study of a particular portion of the incident light spectrum. This portion of the spectrum is tunable by adjustment of the strain, and hence band gap, between measurements. This technique permits both of the essential functions of a spectrometer, i.e. light filtering and light detection, to be implemented in a single device: the photodiode. Constraints inherent in the use of separate filtering and detection mechanisms, or the need for optical propagation, in prior spectrometers are therefore obviated. With these fundamental impediments to miniaturization removed, scaling down to the nanoscale is achieved in embodiments of the invention. Moreover, performance improvements can be achieved over prior MEMS-based spectrometers. The need for careful alignment of optical components associated with prior systems is also avoided. Spectrometers according to embodiments of the invention thus offer the prospect of implementation of optical spectroscopy in applications previously unthinkable. These and other advantages will be discussed in more detail below.

In some embodiments, the measurement apparatus includes: a measurement circuit for measuring the photocurrent-versus-strain characteristic as strain is adjusted by the straining mechanism; and a measurement processor for processing the characteristic to determine variation of photocurrent with strain at different values of said adjustable strain. This will be described in more detail below.

In other embodiments, the straining mechanism is adapted to impose strain having an adjustable constant strain component and a time-varying strain component, and the measurement apparatus includes a measurement circuit for measuring photocurrent variation due to the time-varying strain component. In these embodiments, superposition of the time-varying strain component on the constant strain component causes the band gap to vary from the constant level, say $E_C$, due to the constant strain component. The resulting variation of photocurrent is therefore due to photons with energies above/below $E_C$ as $E_g$ is increased/decreased relative to $E_C$ by the time-varying strain component. The time varying strain component can thus be used to study photons within a desired energy range about $E_C$, and $E_C$ is easily tunable by simple adjustment of the constant strain component between measurements. The measurement circuit in these embodiments may measure the variation in photocurrent directly or indirectly, i.e. by measuring current per se or some quantity dependent thereon, to obtain a measurement indicative of photocurrent variation due to the time-varying strain component. Various forms of time-varying strain component might be envisaged in different embodiments. In preferred embodiments, however, time-varying strain component oscillates at a predetermined frequency f. The measurement circuit can then be adapted to measure the photocurrent variation at a frequency nf where n is a positive integer. This is conveniently achieved using a lock-in circuit.

In spectrometers embodying the invention, the photodiode might in principle be formed in a bulk structure, e.g. with dimensions of the order of microns or higher, though preferred embodiments exploit the potential for size reduction offered by the combined functionality described above. Hence, the photodiode in preferred embodiments may be formed in a nanostructure, having at least one dimension on the nanoscale (i.e. of sub-micron size, typically of the order of nanometers up to hundreds of nanometers). In particularly preferred embodiments, the photodiode is formed in a nanowire. Nanowire embodiments offer extreme miniaturization and can also exploit the enhanced effect on band gap modulation achievable in such "one-dimensional" structures. The nanowires can be formed with a variety of cross-sectional shapes, including generally circular, ovoid or polygonal shapes, and include ribbon-shaped nanowires or "nanoribbons". Various arrangements of the photodiode heterostructure can also be envisaged. In some embodiments, the photodiode may be formed in a nanowire as an axial heterostructure, i.e. with the components of the heterostructure arranged along the longitudinal axis of a nanowire. In other embodiments, the photodiode heterostructure could be formed in the transverse direction of the nanowire, i.e. generally orthogonally to its length. For example, depending on cross-sectional shape, the heterostructure might be formed from one side to another across the width of the nanowire. Alternatively, the heterostructure can be formed from the interior to the exterior of the nanowire as a so-called radial heterostructure (where "radial" here means in a direction generally from the interior to the exterior of nanowire and is not intended to imply any limitation on cross-sectional shape, e.g. to generally circular cross-sections).

In particularly simple embodiments, the straining mechanism is arranged to impose uniaxial strain on the photodiode, e.g. directed along the length of a nanowire photodiode. In principle, tensile or compressive strain might be employed depending on the particular nature of the structures and materials employed and the effect of strain on the band gap in a given case. In preferred embodiments detailed below, a tensile uniaxial strain is applied along the axis of a nanowire photodiode.

For reasons discussed further below, preferred embodiments of the spectrometer include a polarizer adapted to transmit a predetermined polarized component of incident light to the photodiode. In embodiments with nanowire photodiodes, the polarizer is preferably adapted to transmit a component of incident light with polarization either parallel or orthogonal (and most preferably orthogonal) to the axial direction of the nanowire. Such a polarizer could be formed, for example, as a coating on the photodiode.

According to an embodiment of another aspect of the invention there is provided a method for spectroscopy, the method includes the steps of:
  exposing a photodiode to light,
  imposing adjustable strain on the photodiode by a straining mechanism;
  measuring variation of photocurrent with strain at different values of said adjustable strain imposed by the straining mechanism.

According to an embodiment the spectroscopy or spectral analysis is used to measure a property of light, in particular the intensity of light, as a function of the wavelength.

Before describing embodiments of the invention in detail, it is useful first to consider some basic principles underlying operation of the embodiments to be described.

FIG. 1 is a schematic representation of the energy band structure of a PIN photodiode and indicates the basic principle of photodiode operation. The upper section represents the conduction band of the PIN diode structure which has P-type (P), Intrinsic (I), and N-type (N) doping regions as indicated. The lower section represents the valence band. The energy band gap between the conduction and valence bands is denoted by $E_g$. The arrows indicate the process of carrier excitation which occurs on absorption of a photon with energy $E_p > E_g$, where $$E_p = \hbar\omega = hc/\lambda$$

and: $\lambda$ is the photon wavelength; $\omega$ is angular frequency; c is the speed of light, and $h = 2\pi\hbar$ is Planck's constant. Photons of energy greater than the band gap can generate an electron-hole pair, represented by the circles in the figure, causing a transition between the valence and conduction bands. Due to the electric field between the P and N doped regions, charge separation takes place and a photocurrent is generated.

Figure 2:
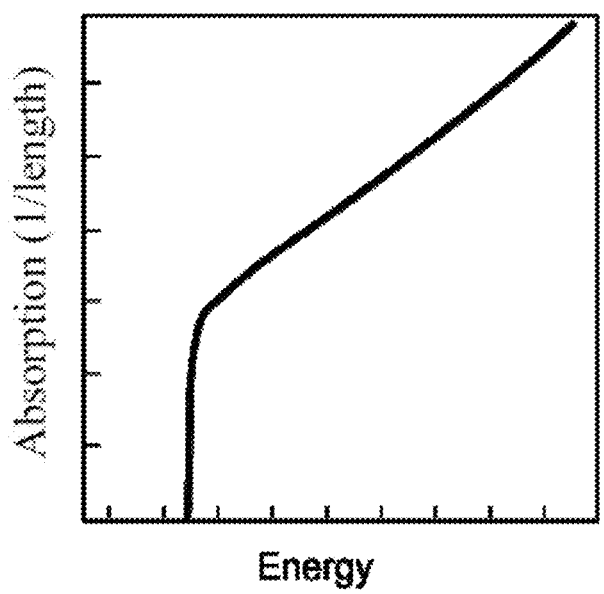
FIG. 2 shows an absorption spectrum for a photodiode.

FIG. 2 indicates the absorption spectrum of a GaAs photodiode due to the process described above. Light absorption (ordinate in the figure) is strongly dependent on photon energy (abscissa in the figure), increasing sharply at the band gap energy $E_g$. This gives a step-like profile for the absorption spectrum with the edge of this step, the "absorption edge", occurring at $E_g$.

The energy band system in semiconductor structures such as nanowires can be modified by subjecting the structure to a strain. We have observed, for instance, that the band gap of a semiconductor nanowire scales linearly with uniaxial strain along the longitudinal nanowire axis. Semiconducting nanowires also have very favorable mechanical and electronic properties, leading to enhancement of the effect of strain (compared to bulk materials) on the change in energy gap. We have also observed that, when the photoluminescence process, i.e. light generation due to charge recombination, occurs in a nanowire, the light emitted by the nanowire includes two linearly-polarized components. The two components have polarizations which are respectively parallel and orthogonal to the axial direction of the nanowire. Peak emission occurs at different wavelengths for the two components. If the nanowire is subjected to strain, then the resulting change in the band gap $E_g$ causes a corresponding energy shift in the photoluminescence emission spectrum. We have further observed that the light component with polarization orthogonal to the nanowire axis undergoes the highest shift under imposed strain.

Figure 3:
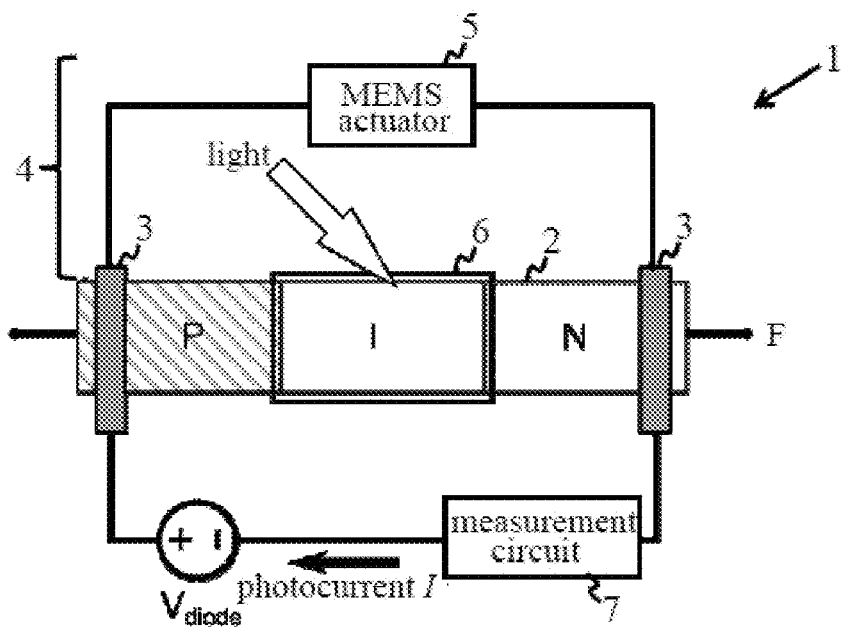
FIG. 3 is a schematic representation of an optical spectrometer according to an embodiment of the invention.

The embodiments to be described exploit the basic principles described above to implement an optical spectrometer. An example of a spectrometer embodying the invention is illustrated schematically in FIG. 3. The spectrometer 1 includes a PIN photodiode 2 formed in a semiconductor nanowire. In this example, the photodiode is formed as an axial heterostructure with the P-type, intrinsic, and N-type sections arranged as indicated along the longitudinal axis of the nanowire. Electrical contacts 3 are formed as a conductive layer surrounding each end of the nanowire. In this embodiment, the electrical contacts 3 also serve as mechanical clamps of a straining mechanism indicated generally at 4. In addition to clamp-contacts 3, the straining mechanism 4 includes a MEMS actuator 5. The actuator 5 is operable to apply a force F along the longitudinal axis of the nanowire via clamp-contacts 3. The force F imposes a tensile strain on the photodiode. This strain is a uniaxial strain directed along the length of the nanowire corresponding to the direction of applied force F. The spectrometer 1 also includes a polarizer 6 which is adapted to transmit to the photodiode a linearly-polarized component of incident light with polarization orthogonal to the nanowire axis. In this embodiment, the polarizer 6 includes a coating of polarizing material on the photodiode. The polarizing coating 6 extends at least over the intrinsic section I which is exposed to light to be analyzed in operation. A bias voltage $V_{diode}$ is applied between electrical contacts 3 to reverse-bias the PIN junction in use. The spectrometer also includes measurement apparatus in the form of a measurement circuit 7 connected between electrical contacts 3 for measuring variation in the photocurrent I as discussed further below.

The photodiode 2 can be fabricated using standard semiconductor processing techniques and suitable materials and processes will be readily apparent to those skilled in the art. The nanowire may be formed of a wide variety of semiconductor materials, some examples being Silicon, Germanium, binary alloys like III-V compounds (i.e. AlAs, InP, GaP, GaN, InSb) or II-VI compounds (i.e. ZnO, CdS, CdSe), as well as their possible ternary (i.e. GaInP, GaInAs, etc.) and quaternary compounds (i.e. GaInAsP, etc.). The nanowire can be formed with a variety of cross-sectional shapes, such as circular, ovoid, rectangular, hexagonal or other polygonal shapes, as desired. While the dimensions of nanowire photodiode 2 may vary in different embodiments, the length will typically be chosen between 10 nm and 100 μm, and the thickness will typically be chosen between 10 nm and 1 μm. Polarizer 6 may be formed in known manner, e.g. using metal nanoparticle thin films, and may be formed as a coating or, in other embodiments, as a separate component. Suitable materials and techniques for implementing polarizer 6 will be apparent to those skilled in the art.

Figure 4:
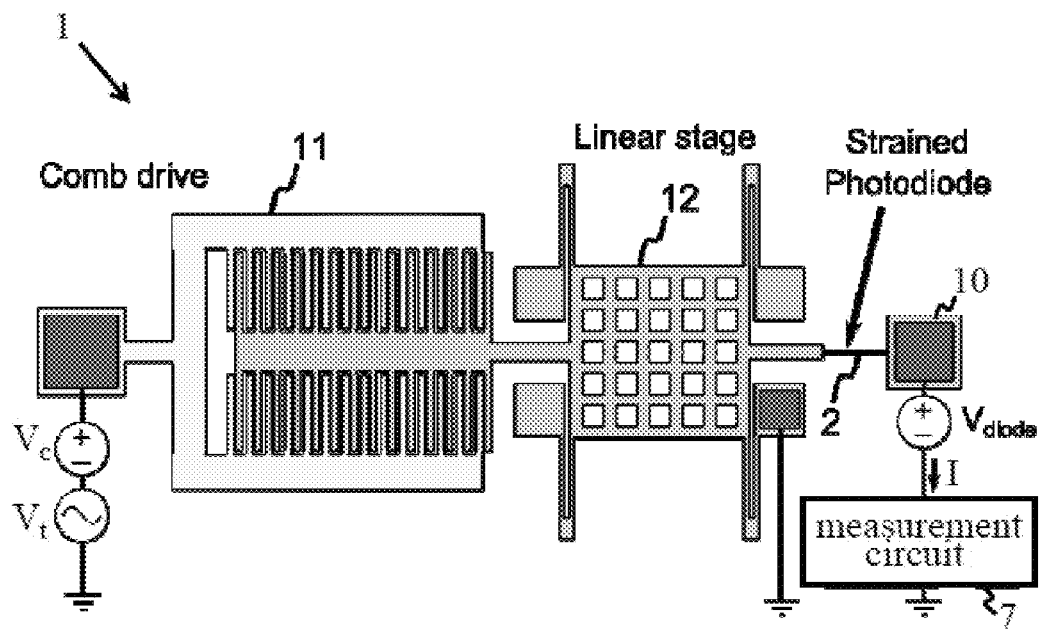
FIG. 4 shows exemplary implementation details for the FIG. 3 spectrometer.

An exemplary implementation of the straining mechanism 4 is illustrated in FIG. 4. This figure shows the photodiode 2 connected between a support 10 and a MEMS actuator 5 (shown in FIG. 3) that combines a comb drive 11 with linear stage 12. The support 10 is connected to the measurement circuit 7. The force F applied by the straining mechanism is such that the strain imposed on the photodiode has a constant strain component and a time-varying strain component. In particular, the power supply for comb drive 11 generates a constant voltage $V_c$ and a time-varying voltage $V_t$. In this preferred embodiment, the voltage $V_t$ is a sinusoidal voltage which is typically of small amplitude compared to voltage level $V_c$. Superposition of the two supply voltages $V_c$ and $V_t$ results in the force F applied by the straining mechanism having constant and time-varying components corresponding to the voltage components $V_c$ and $V_t$. The resulting strain $\epsilon$ imposed on the photodiode thus has a constant strain component $\epsilon_c$ and a time-varying strain component $\epsilon_t$ due to the corresponding components of the applied force F. The magnitude of the constant strain component $\epsilon_c$ is adjustable by changing the constant voltage level $V_c$. The time-varying strain component $\epsilon_t$ in this embodiment oscillates at a predetermined frequency corresponding to the frequency of supply voltage $V_t$.

Figure 5:
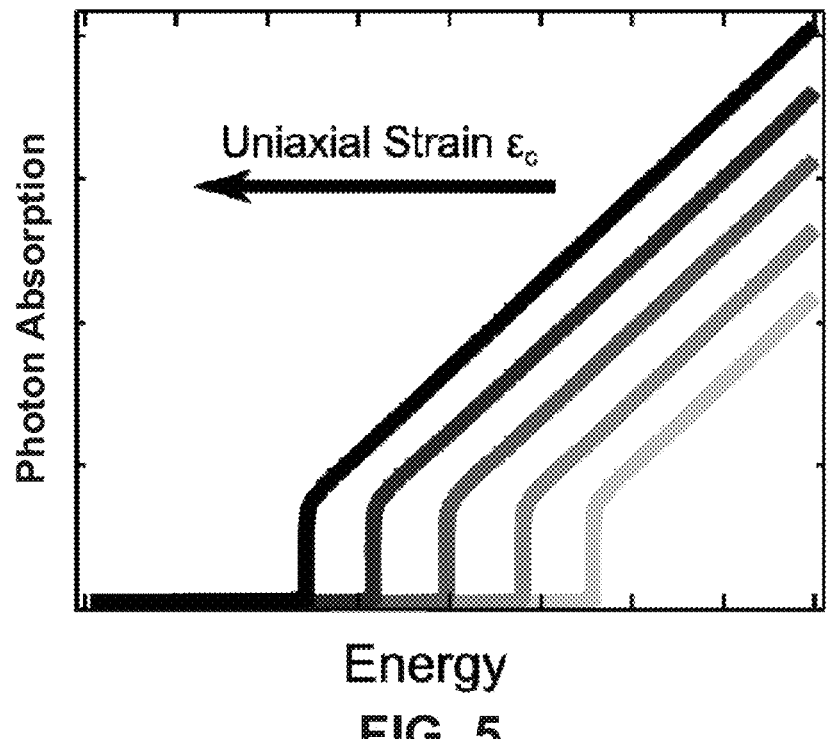
FIG. 5 indicates effect of strain on the photodiode absorption spectrum in the FIG. 3 spectrometer.
Figure 6A:
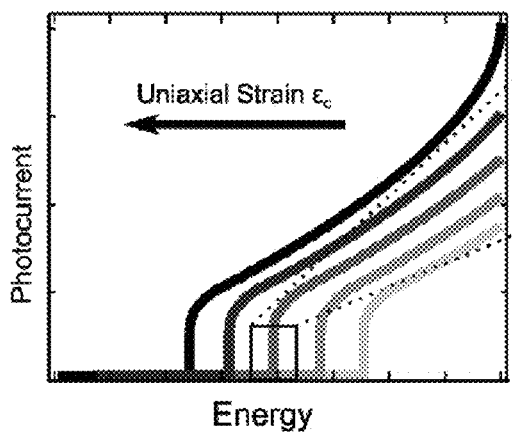
FIG. 6A indicates the effect on photocurrent of adjusting a constant strain component in this embodiment.

In operation of the spectrometer 1, the effect of constant strain component $\epsilon c$ is to determine the particular portion of the energy spectrum to be analyzed in a measurement operation. As the constant strain component $\epsilon_c$ is adjusted by changing $V_c$, the band gap $E_g$ of the photosensitive region of the photodiode varies accordingly. Based on the principles described above with reference to FIGS. 1 to 3, the absorption spectrum for the polarized light incident on photodiode 2 will be shifted as $V_c$, and hence $\epsilon_c$, is adjusted and the band gap $E_g$ is changed. In particular, the spectrum will be shifted so that the absorption edge corresponds to the new band gap energy $E_g$. This effect is illustrated in FIG. 5 which shows the photodiode absorption spectrum shifting to lower energies, and hence higher wavelengths, with increasing values of the constant strain component $\epsilon_c$. The corresponding effect on the photocurrent I due to adjustment of the constant strain component is illustrated in FIG. 6A.

Figure 6B:
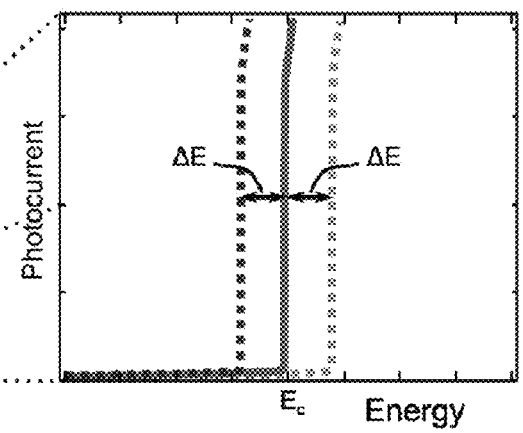
FIG. 6B indicates the effect on photocurrent of a time-varying strain component in this embodiment.
Figure 7:
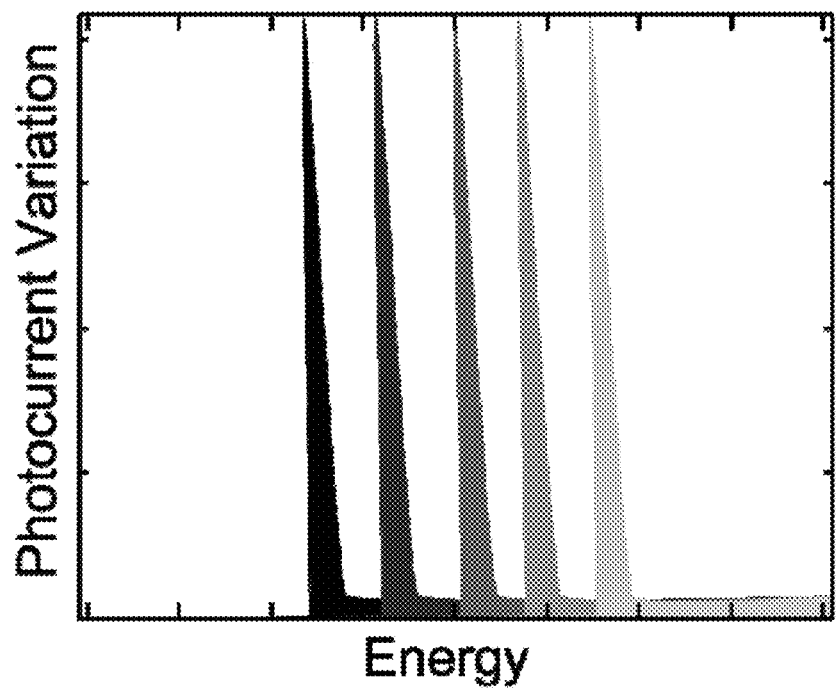
FIG. 7 illustrates photocurrent variation due to the time-varying strain component at different values of the constant strain component.

The effect of time-varying strain component $\epsilon_t$ is to impose a strain modulation on top of the constant strain component $\epsilon_c$. This causes a corresponding modulation in the band gap about the constant value, $E_c$, due to the constant strain component. The resulting effect on the photocurrent I due to the time-varying shift in the absorption spectrum is illustrated schematically in the enlargement of FIG. 6B. As $E_g$ increases and decreases relative to $E_C$ with the strain modulation, the photocurrent profile will shift accordingly to higher and lower energies, with the amplitude $\Delta E$ of this shift depending on the amplitude of oscillatory voltage $V_t$. The variation in photocurrent due to this time-varying shift is thus due to photons within the small energy range $E_C-\Delta E$ to $E_C+\Delta E$. This variation is the energy derivative of the photocurrent vs. energy curve and corresponds to a sharp peak located close the band gap energy $E_C$. This is illustrated in FIG. 7 which represents photocurrent variation due to strain modulation at different values of the constant strain component $\epsilon_c$ and hence band gap energy $E_c$. For a given value of $\epsilon_c$ and hence $E_c$, the photocurrent variation is proportional to the number of incident photons, and hence light intensity, in the small energy range about $E_c$ set by the strain modulation. The constant strain component can therefore be adjusted to tune the spectrometer 1 to a region of the spectrum of interest, and the time-varying strain component then permits acquisition of a measurement indicative of intensity of particular wavelengths in this region.

The effect of polarizer 6 in the above embodiment is to restrict the measurement to a single polarization component of the incident light. This avoids a potential problem suggested by the observations discussed above whereby absorption of photons with different polarization is affected differently by a given change in the band gap. In particular, the absorption spectrum of the two (axial and orthogonal) polarization components can be predicted to shift by different amounts with a given induced strain. In the absence of polarizer 6, therefore, the wavelengths contributing to photocurrent variation due to the time varying strain component would be different for the two polarization components. Note that, in this preferred embodiment, the wavelength sensitivity range is enhanced by selecting for the measurement operation the polarization component which exhibits the largest shift in response to variation in the band gap.

The photocurrent variation due to the time-varying strain component is measured by measurement circuit 7. Various forms of measurement circuit can be envisaged here, and the particular implementation can be designed according to requirements in a given system. In this preferred embodiment, the measurement circuit 7 includes a lock-in circuit for measuring the photocurrent variation at the particular frequency f of the strain modulation determined by oscillatory voltage $V_f$. Alternatively, the lock in circuit may measure the photocurrent variation at any multiple of this frequency, i.e. at a frequency nf where n is a positive integer. The particular order of the derivative measured here can be selected as that giving the highest sensitivity. The lock-in circuit operates in known manner to measure the particular component of the photocurrent vs. frequency spectrum which corresponds to the frequency in question. Such lock-in circuits are well known and used widely in signal processing applications, and suitable implementations for measurement circuit 7 will be readily apparent to those skilled in the art. The resulting measurement output by measurement circuit 7 thus corresponds to the intensity of incident light in the wavelength region of interest.

The technique described above permits probing of the energy spectrum of incident light at energies close the band gap energy $E_c$, where the value of $E_c$ is easily tuned by simple adjustment of the constant stain component $\epsilon_c$ via voltage $V_c$. Measurements can thus be performed at a succession of different values of $E_c$ spanning the optical spectrum to be analyzed. In this way, an optical spectrum can be acquired using a single device, the photodiode, which performs both of the filtering and detection functions essential to spectroscopy. The need for careful alignment of optical components inherent in prior systems is therefore avoided. Implementation of photodiode 2 in a nanowire exploits the enhanced effect of strain on band gap modulation in such structures, and permits miniaturization of the spectroscope easily to the nanoscale. In addition, the simple, combined measurement technique offers significant performance improvements over prior MEMS-based systems. Uniaxial stress allows the band gap of the nanowire to be tuned over a very broad range, of the order of hundreds of meV, corresponding to several hundreds of nanometers in wavelength. Spectrometers embodying the invention can be more than hundred times smaller than current state-of-the-art microspectrometers and can outperform them by more than doubling the spectral range. Furthermore, through combination of the filtering and detection functions, the spectrometer is fundamentally simplified and can be fabricated cheaply. In addition, as photodiode nanowires can be grown on various substrates and materials, direct integration of spectroscopes into more complex, but still very tiny, systems is readily possible.

Due to the reduction in footprint and avoidance of the need for careful alignment of optical components, optical spectroscopes embodying the invention may be integrated into applications previously unthinkable. Such spectrometers could significantly boost the development of silicon photonics systems. The small device dimensions and broad wavelength range achievable in preferred embodiments would enable optical communications to be implemented over a broader wavelength range and with high density, e.g. for on-chip communications. Spectrometers embodying the invention could also be used as an integrated nanoscale biochemical or material analysis sensor, enabling various different kinds of chemical analysis. To mention a few examples, such spectrometers could be used to detect fluorescent tags that luminesce at particular wavelengths, boosting performance of current lab-on chip systems. Spectrometers embodying the invention might also be used within a nano-pore system, together with fluorescent tags, to enhance the sensitivity of DNA sequencing systems. Material analysis by absorption spectroscopy can also be performed using spectrometers embodying the invention. Moreover, the extreme miniaturization offered by embodiments of the invention allows scanning-probe optical spectroscopy to be envisaged. The photodiode of the spectroscope could be provided on a tip of a scanning-probe microscope device, permitting analysis of a sample by optical spectroscopy as the sample is scanned by the tip. Such scanning-probe optical spectroscopy could be performed with unprecedented lateral resolution and at much lower cost than previously possible.

Figure 8:
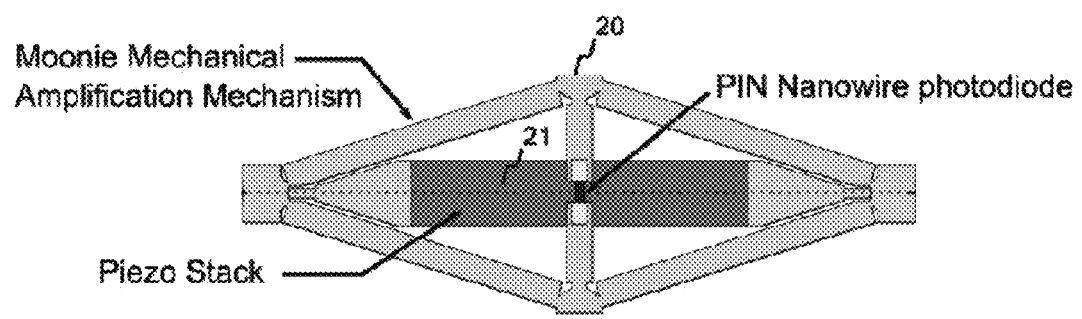
FIG. 8 shows an alternative implementation of a straining mechanism for a spectrometer according to an embodiment of the invention.

While a preferred embodiment has been detailed above, numerous alternatives and modifications can be envisaged. The straining mechanism 4, for instance, could be implemented in numerous ways. By way of example, FIG. 8 illustrates one alternative implementation of MEMS actuator 5. This figure shows the PIN nanowire photodiode 2 of FIG. 3 mounted between arms of a Moonie mechanical amplifier 20 which is driven by a stack 21 of piezoelectric devices. Deformation of the piezo stack on application of the supply voltage causes contraction of the actuator in the lateral direction of the figure. This causes the arms supporting nanowire 2 to be drawn apart, applying the force F which imposes strain on the nanowire. In general, the actuator 5 of spectrometer 1 can be realized with various different MEMS technologies based on electrostatic, piezo-electric or other types of actuation. Mechanical amplifiers may or may not be included in such mechanisms as required. An appropriate actuation mechanism can be selected as desired based on particular device requirements e.g. cost, robustness, integration density, power consumption, etc.

Various forms of measurement circuit 7 can also be envisaged in the above embodiment, and the particular implementation can be designed according to requirements in a given system. The form of the measurement circuit can depend, for instance, on the particular way in which photocurrent variation is measured and the degree of accuracy required in the system. As a particularly simple example, a basic difference circuit for determining the difference between minimum and maximum photocurrent levels due to the strain modulation, or the difference between $E_c$ and this minimum or maximum value, might be sufficient in some scenarios.

Figure 9:
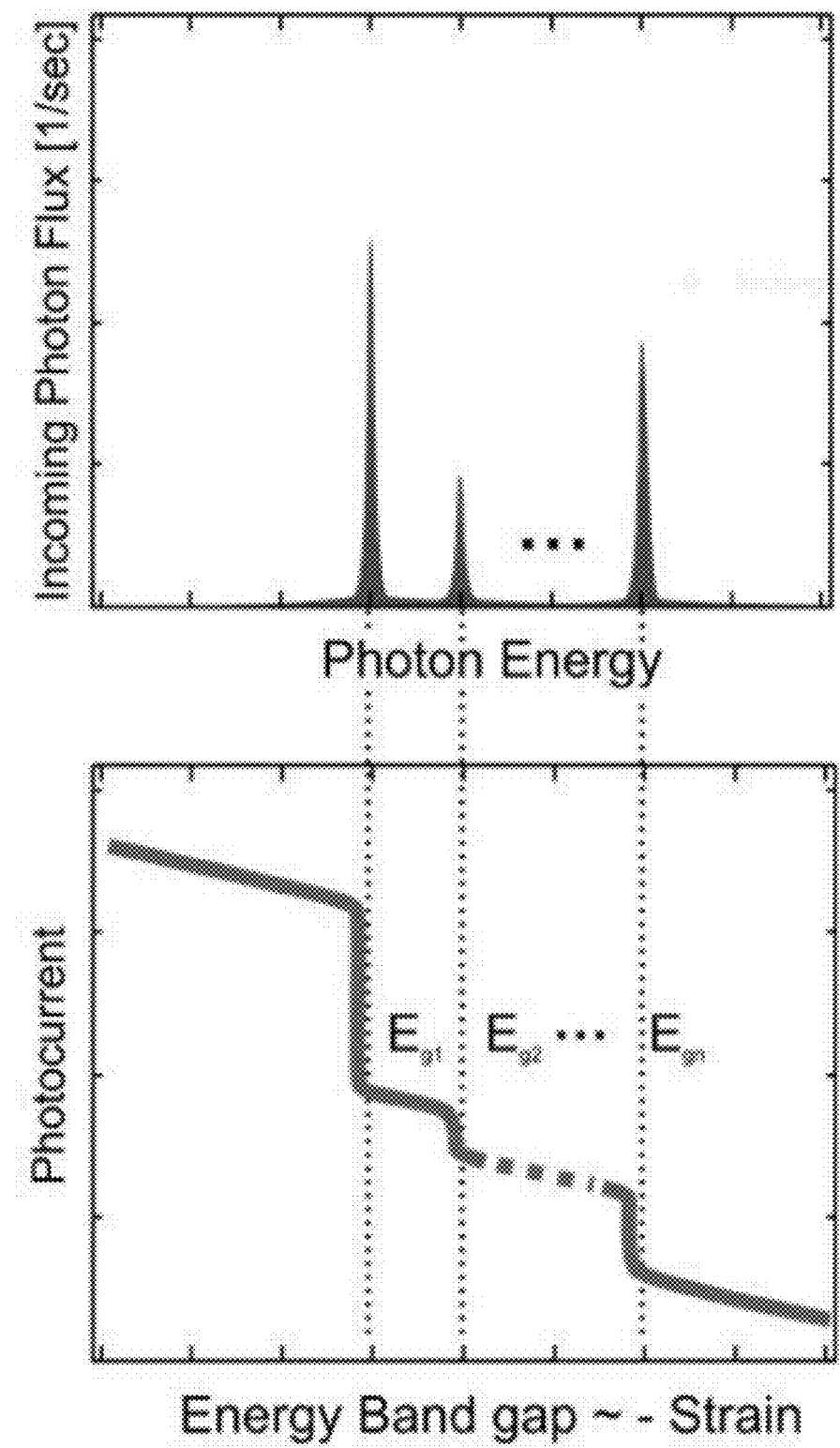
FIG. 9 illustrates operation of measurement apparatus in an alternative spectrometer according to an embodiment of the invention.

Other spectrometers embodying the invention may employ a different technique for measuring the variation of photocurrent with strain at different values of the adjustable strain imposed by the straining mechanism. In these embodiments, the measurement apparatus can use a simple current measurement circuit to measure the photocurrent-versus-strain characteristic as the strain ϵ is adjusted by the straining mechanism. The measurement apparatus includes a measurement processor for processing this characteristic to determine variation of photocurrent with strain at different values of the adjustable strain. In particular, the straining mechanism can gradually adjust the strain imposed on the photodiode to vary the band gap energy $E_g$ across the overall energy range of interest. The photocurrent during this procedure is measured by the measurement circuit to acquire the characteristic photocurrent-versus-strain (and hence energy) curve for the incident light. An example of such a photocurrent v. strain characteristic is illustrated schematically in FIG. 9. Each point on this curve corresponds to the photocurrent at a particular value of the band gap energy $E_g$. At any given value, say $E_{g1}$, of the band gap energy, calculation of the numerical derivative $dI/d\epsilon$ at the corresponding point on the curve gives the variation in photocurrent $\Delta I$ due to a small change $\Delta E$ in the band gap energy about $E_{g1}$. This photocurrent variation $\Delta I$ is dependent on the number of incident photons, and hence light intensity, within the small energy range $\Delta E$ of $E_{g1}$. Hence, by processing the photocurrent vs. strain characteristic to determine this photocurrent variation $\Delta I$ at a plurality of values $E_{g1}$ to $E_{gn}$, the light spectrum can be analyzed across the energy range of interest. The measurement processor in this embodiment therefore processes the acquired photocurrent vs. strain characteristic in this way, calculating variation of photocurrent with strain at a plurality of different values of the adjustable strain covering the required energy range in the incident light spectrum. Such a measurement processor may be implemented, in general, in hardware or software or a combination thereof, and suitable implementations will be readily apparent to those skilled in the art.

Figure 10:
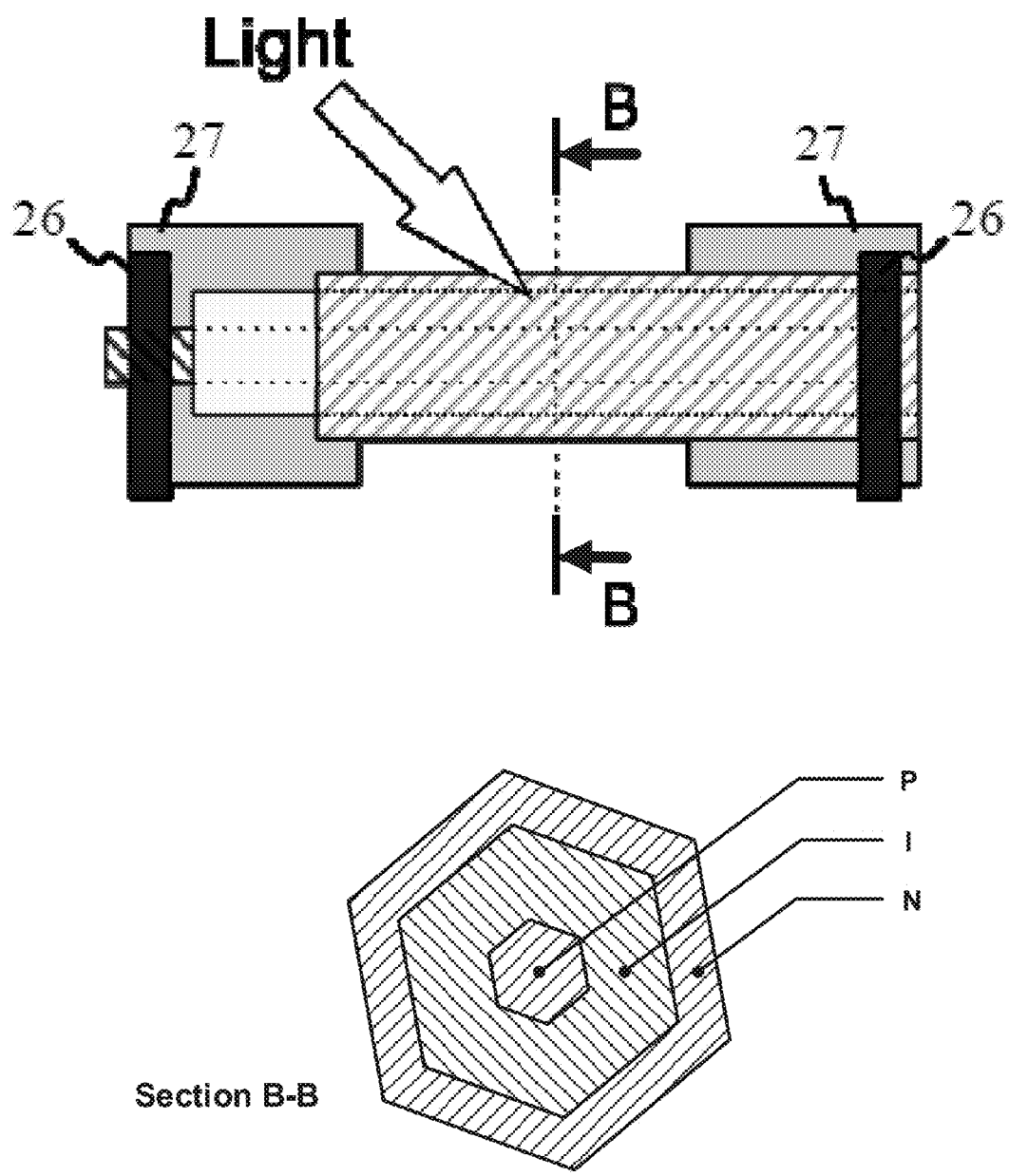
FIG. 10 illustrates an alternative photodiode heterostructure for a spectrometer according to an embodiment of the invention.

An alternative implementation of the PIN photodiode is illustrated in FIG. 10. This photodiode 25 has a hexagonal cross-section and is formed as a radial heterostructure, the P-type, intrinsic and N-type sections of the structure being arranged in the radial direction of the nanowire. The polarizer is omitted from this figure for simplicity. Due to the more delicate nature of the photodiode heterostructure in this embodiment, mechanical clamps 27 for the straining mechanism are provided in addition to electrical contacts 26. Again, various materials can be employed in this embodiment and suitable materials will be apparent to those skilled in the art. In general in embodiments of the invention, the particular choice of semiconducting materials can be guided by the optical spectral region of interest which will depend, in turn, on the particular application. The choice of materials and/or dimensions in axial and radial nanowire heterostructures can be leveraged to enhance the effect of strain on the band gap energy, as well as to engineer the optical absorption profile and, ultimately, the spectrometer light conversion efficiency and resolution.

Other nanowire photodiode heterostructures, e.g. a combination of axial and radial heterostructures, can also be envisaged. While nanowire embodiments offer extreme miniaturization, other photodiode structures, such as microstructures or different nanostructures, could be employed if desired. For example, a membrane or sheet-like structure, which may have only one dimension on the nanoscale, can be envisaged. Also, while PIN photodiodes are preferred for their greater sensitivity, a PN photodiode could be employed in some embodiments.

While the polarizer is conveniently implemented as a coating on the photodiode, a polarizer can of course be provided as a separate optical component. Particular embodiments and applications where a polarizer is not required might also be envisaged. In some embodiments, for example, post-processing of measurements could be performed to isolate the contribution from a particular polarization component.

For some applications, for example in absorption spectroscopy, a spectrometer embodying the invention may include a light source. Such a light source can be implemented as appropriate for a given application. A light source may, for instance, be integrated in a semiconductor structure of the spectrometer, e.g. as a light-emitting diode.

It will be appreciated that many other changes and modifications can be made to the exemplary embodiments described without departing from the scope of the invention.

The invention claimed is:

1. An optical spectrometer comprising:
   a photodiode;
   a straining mechanism for imposing adjustable strain on the photodiode, the straining mechanism being adapted to impose strain having an adjustable constant strain component and a time-varying strain component; and
   a measurement apparatus for measuring variation of photocurrent with strain at different values of said adjustable strain imposed by the straining mechanism, the measurement apparatus including a measurement circuit for measuring photocurrent variation due to the time-varying strain component.

2. The optical spectrometer as claimed in claim 1, wherein the measurement apparatus comprises:
   a measurement circuit for measuring a photocurrent-versus-strain characteristic as said strain is adjusted by the straining mechanism; and
   a measurement processor for processing said characteristic to determine variation of photocurrent with strain at different values of said adjustable strain.

3. The optical spectrometer as claimed in claim 1, wherein the time-varying strain component oscillates at a predetermined frequency f.

4. The optical spectrometer as claimed in claim 3, wherein the measurement circuit is adapted to measure the photocurrent variation at a frequency nf where n is a positive integer.

5. The optical spectrometer as claimed in claim 4, wherein the measurement circuit comprises a lock-in circuit.

6. The optical spectrometer as claimed in claim 1, wherein the photodiode comprises a PIN photodiode.

7. The optical spectrometer as claimed in claim 1, wherein the photodiode is formed in a nanostructure.

8. The optical spectrometer as claimed in claim 1, wherein the photodiode is formed in a nanowire.

9. The optical spectrometer as claimed in claim 8, wherein the photodiode is formed in the nanowire as an axial heterostructure.

10. The optical spectrometer as claimed in claim 8, wherein the photodiode is formed in the nanowire as a radial heterostructure.

11. The optical spectrometer as claimed in claim 1, wherein the straining mechanism is arranged to impose uniaxial strain.

12. The optical spectrometer as claimed in claim 11, wherein the photodiode is formed in a nanowire having a length and wherein the uniaxial strain is directed along the length of the nanowire.

13. The optical spectrometer as claimed in claim 1, wherein the strain is tensile.

14. The optical spectrometer as claimed in claim 1, wherein the straining mechanism comprises a microelectromechanical systems (MEMS) actuator.

15. The optical spectrometer as claimed in claim 14, wherein the straining mechanism includes a mechanical amplifier.

16. The optical spectrometer as claimed in claim 1, the spectrometer further including a polarizer adapted to transmit a predetermined polarized component of incident light to the photodiode.

17. The optical spectrometer as claimed in claim 16, wherein the photodiode is formed in a nanowire and wherein the polarizer is adapted to transmit a component of incident light with polarization parallel to an axial direction of the nanowire.

18. The optical spectrometer as claimed in claim 16, wherein the photodiode is formed in a nanowire and wherein the polarizer is adapted to transmit a component of incident light with polarization orthogonal to an axial direction of the nanowire.

19. The optical spectrometer as claimed in claim 16, wherein the polarizer comprises a coating on the photodiode.

20. The optical spectrometer as claimed in claim 1, wherein the photodiode is provided on a scanning tip for scanning a sample to be analysed by optical spectroscopy.

21. A method for spectroscopy, the method comprising:
exposing a photodiode to light;
imposing adjustable strain on the photodiode by a straining mechanism, wherein the adjustable strain includes an adjustable constant strain component and a time-varying strain component; and
measuring, using a measuring apparatus, variation of photocurrent with strain at different values of said adjustable strain imposed by the straining mechanism, wherein the measuring the variation of photocurrent includes measuring variation due to the time-varying strain component.

* * * * *